United States Patent [19]
de Veer

[11] Patent Number: 5,258,890
[45] Date of Patent: Nov. 2, 1993

[54] DEVICE FOR CONNECTING THE CONNECTION PINS OF AN INTEGRATED CIRCUIT MOUNTED IN A DUAL-IN-LINE (DIL) PACKAGE TO PRINTED CIRCUITRY ON A PRINTED CIRCUIT BOARD IN N DIFFERENT WAYS

[75] Inventor: Henricus J. M. de Veer, Lith, Netherlands

[73] Assignee: Tulip Computers International B.V., Netherlands

[21] Appl. No.: 843,923

[22] Filed: Feb. 21, 1992

[30] Foreign Application Priority Data

Feb. 22, 1991 [NL] Netherlands .......................... 9100321

[51] Int. Cl.$^5$ .............................................. H05K 7/02
[52] U.S. Cl. ..................................... 361/783; 174/261; 361/777; 361/791
[58] Field of Search ................ 174/250, 261; 361/400, 361/397, 409, 410, 413; 439/68, 69

[56] References Cited

U.S. PATENT DOCUMENTS

| | | | |
|---|---|---|---|
| 3,564,114 | 2/1971 | Blinder | 361/410 |
| 3,670,208 | 6/1972 | Hovnanian et al. | 317/101 |
| 3,917,984 | 11/1975 | Kong et al. | 317/101 |

FOREIGN PATENT DOCUMENTS

961986 1/1975 Canada .............................. 361/410
1590612 4/1970 Fed. Rep. of Germany .

Primary Examiner—Gregory D. Thompson
Attorney, Agent, or Firm—Peter L. Michaelson; Raymond R. Moser, Jr.

[57] ABSTRACT

A printed circuit board for connecting, in n different ways, connection pins of an integrated circuit mounted in a dual-in-line (DIL) package to printed circuitry on the printed circuit board, where n is an integer $\geq 2$. The printed circuit board comprises contact holes which are electrically connected to the printed circuitry and are each suitable for receiving a connection pin of the DIL package. To avoid the use of so-called jumper blocks for the different ways of connection, the contact holes form a matrix of p columns and q rows, with p being at least equal to the number of connection pins on a long side of the DIL package, q being at least equal to 2n, and the distance between successive rows of contact holes being such that $n-1$ rows of free contact holes are located between the rows of connection pins on the opposite long sides of the DIL package when these rows of connection pins have been mounted in two rows of contact holes. The contact holes are preferably located in an IC base, so that the desired connection can be chosen by placing the package in this base in one of the n possible ways.

4 Claims, 1 Drawing Sheet

DEVICE FOR CONNECTING THE CONNECTION PINS OF AN INTEGRATED CIRCUIT MOUNTED IN A DUAL-IN-LINE (DIL) PACKAGE TO PRINTED CIRCUITRY ON A PRINTED CIRCUIT BOARD IN N DIFFERENT WAYS

BACKGROUND OF THE INVENTION

1. Field of the Invention

This invention relates to a device for connecting the connection pins of an integrated circuit mounted in a dual-in-line (DIL) package to printed circuitry on a printed circuit board in n different ways, with n being an integer $\geq 2$, the printed circuit board comprising contact holes which are electrically connected to the printed circuitry and are each suitable for receiving a connection pin of the DIL package.

2. Description of the Prior Art

In the manufacture of printed circuit boards having provided thereon integrated circuits, hereinafter referred to as IC's, it is sometimes desirable, for instance when printed circuit boards for computers are involved, that at assembly of the computer, or possibly later during maintenance work, the connection pins of the dual-in-line (DIL) package in which an IC is mounted can be connected in different ways, as desired, with other parts of the electronic circuitry provided on the printed circuit board. For instance, in the case of a printed circuit board for a computer, such alternative connections are desirable especially where the circuitry provided on the printed circuit board comprises an isolating transformer IC and provisions are required to enable secondary connections thereof to be connected to connections for three different interfaces.

To solve this problem, heretofore use has been made of pairs of parallel rows of pins provided on the printed circuit board, while the corresponding pins of one pair of rows can be interconnected by means of interconnecting elements. Such pairs of rows consisting of pins are commonly referred to as jumper blocks, which name will accordingly be used hereinafter. In the above-mentioned example, where provisions are required to enable the secondary connections of an isolating transformer to be connected to three interfaces, as such the printed circuit board must comprise at least three jumper blocks, with the rows of pins of a jumper block comprising the interconnecting elements to enable the secondary connections of the isolating transformer IC to be connected to an output of the desired interface.

A disadvantage of using jumper blocks is that they occupy a relatively large surface area on the printed circuit board, which is undesirable in view of increasing miniaturization of devices. Moreover, when using jumper blocks, additional space is required on the printed circuit board for the printed circuitry that necessarily leads to the various pins of the jumper blocks. Further, it is time-consuming and laborious to provide the interconnecting elements for the desired jumper blocks during manufacture of the printed circuit board or later during maintenance work.

SUMMARY OF THE INVENTION

It is an object of the present invention to provide a solution to the above-described connection problems that does not have the drawbacks of the technique used heretofore.

To that end, the invention provides a device of the type described hereinabove, wherein the contact holes form a matrix of p columns and q rows, with p being at least equal to the number of connection pins on a long side of the DIL package, q being at least equal to 2n, and the distance between successive rows of contact holes being such that n−1 rows of free contact holes are located between the rows of connection pins on the opposite long sides of the DIL-package when these rows of connection pins have been mounted in two rows of contact holes.

The contact holes are preferably formed by a so-called IC base having $p \times q$ contact holes, mounted on the printed circuit board.

By virtue of the steps according to the invention, switching the IC mounted in a DIL package only comprises mounting the IC in the IC base in a different way, as will be further clarified hereinafter. Jumper blocks occupying a great deal of space are no longer required and the printed circuitry can be arranged in a simple, space-saving manner, as will be clarified hereinafter.

It is observed that U.S. Pat. No. 3,917,984 discloses a printed circuit board on which a large number of IC's can be mounted in an identical manner for testing purposes and the like. The connection of the pins of the different IC's to external sources can be fixed by mounting suitable interconnections between holes formed in the circuit board. There is not any reference to connecting IC's in different ways by inserting them into the printed circuit board in a different way.

German "Offenlegungsschrift" 1,590,612 discloses a universal matrix of printed circuitry on a printed circuit board, where the desired connections for an IC can be made by choosing suitable interconnections between the circuitry on the topside and the bottom side. These connections, however, are permanent and cannot be changed in use as desired.

BRIEF DESCRIPTION OF THE DRAWINGS

One embodiment of the invention will now be further explained and illustrated, by way of example, with reference to the accompanying drawings, in which.

DETAILED DESCRIPTION OF THE PREFERRED EMBODIMENT

Figure 1:
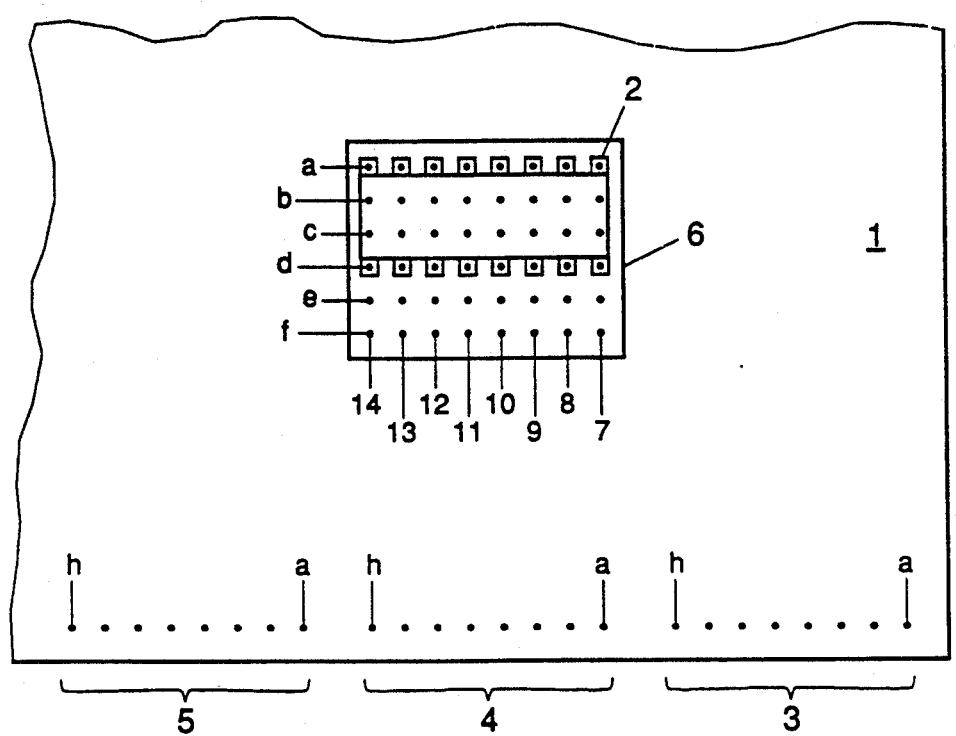
FIG. 1 diagrammatically shows a part of a printed circuit board on which an IC in a DIL package to be connected in three ways has been mounted in the manner according to the invention.

FIG. 1 diagrammatically shows a part of a printed circuit board 1 adapted to enable for instance an IC accommodated in a 16-pin DIL package 2 to be connected thereto, in such a manner that a number of connection pins of the IC, for instance eight, are connected as desired to one of the three outputs, 3, 4 and 5, each consisting of a plurality of connections pins, 3 a–h, 4 a–h, 5 a–h, respectively. The number of connection pins of each output, in this example eight, corresponds to the number of connection pins of the IC to be connected to the connection pins. It will be assumed in this example that the IC is an isolating transformer which galvanically separates a total of eight signals which are intended for, and supplied by, any other electronic circuitry present on the printed circuit board, from the peripheral equipment connected to the outputs 3, 4 or 5. The choice of the outputs 3, 4 or 5 which the secondary connections of the isolating transformer are connected with, can be made either during manufacture of the printed circuit board or afterwards during maintenance work. It is stressed that the type of IC, the number of connections thereof which are to be connected in different ways and the number of connection pins of the DIL package are given only by way of example for a better understanding of the invention and that other types of IC's and DIL packages with more or fewer connection pins and/or with more or fewer connection pins to be connected in different ways can be used within the framework of the invention.

An IC base 6 of a type that is well known to the skilled worker is mounted on the printed circuit board 1 in a conventional manner for that purpose, i.e., via pins on the IC base connected, usually by soldering, to corresponding contact holes in the circuit board. The IC base comprises contact holes (also known as sockets) which are each suitable in a conventional manner for receiving one of the connection pins of the DIL package 2. The IC base comprises eight columns 7-14, each column consisting of six contact holes a-f, i.e., there are also six rows a-f of contact holes and the IC base comprises a total of 48 contact holes. The mutual distance between the columns corresponds to the mutual distance between the contact pins along one of the long sides of a DIL package.

The mutual distance between the successive rows a-f is chosen such that if the DIL package has its connection pins mounted in two rows of contact holes, illustratively, rows a and d, of the base 6, there are two rows of free contact holes, illustratively rows b and c, between the connection pins on the two long sides of the DIL package. It will be clear that in the present example this affords the possibility of mounting the DIL package in three different positions on the base 6 by moving the DIL package to successive rows.

Further, the connection of the contact holes of the IC base 6 with the respective outputs 3 a-h, 4 a-h and 5 a-h on the one hand and the other circuitry (not shown) on the printed circuit board 1 on the other, is chosen such that when the DIL package has its two rows of connection pins mounted in the contact holes of rows a and d, the connection pins on one long side of the DIL package 2 connect via the contact holes in row a to the eight inputs/outputs of the other electronic circuitry on the printed circuit board 1 and the connection pins on the other long side of the DIL package 2 connect via the contact holes in row d to the eight output pins of output 3. When, however, the DIL package 2 has its two rows of connection pins mounted in the contact holes of rows b and e, respectively, the connection pins on one long side of the DIL package continue to connect via the contact holes in row b to the eight inputs/outputs of the other electronic circuitry on the printed circuit board 1, but the connection pins of the other long side connect via the contact holes in row e to the eight output pins of the output 5.

Finally, in the case where the DIL package 2 has its two rows of connection pins mounted in the contact holes of rows c and f, respectively, again the connection pins of the one long side of the DIL package continue to connect via the contact holes in row c to the eight inputs/outputs of the other electronic circuitry on the printed circuit board 1, but the connection pins of the other longs side now connect via the contact holes in row f to the eight output pins of the output 4.

Figure 2:
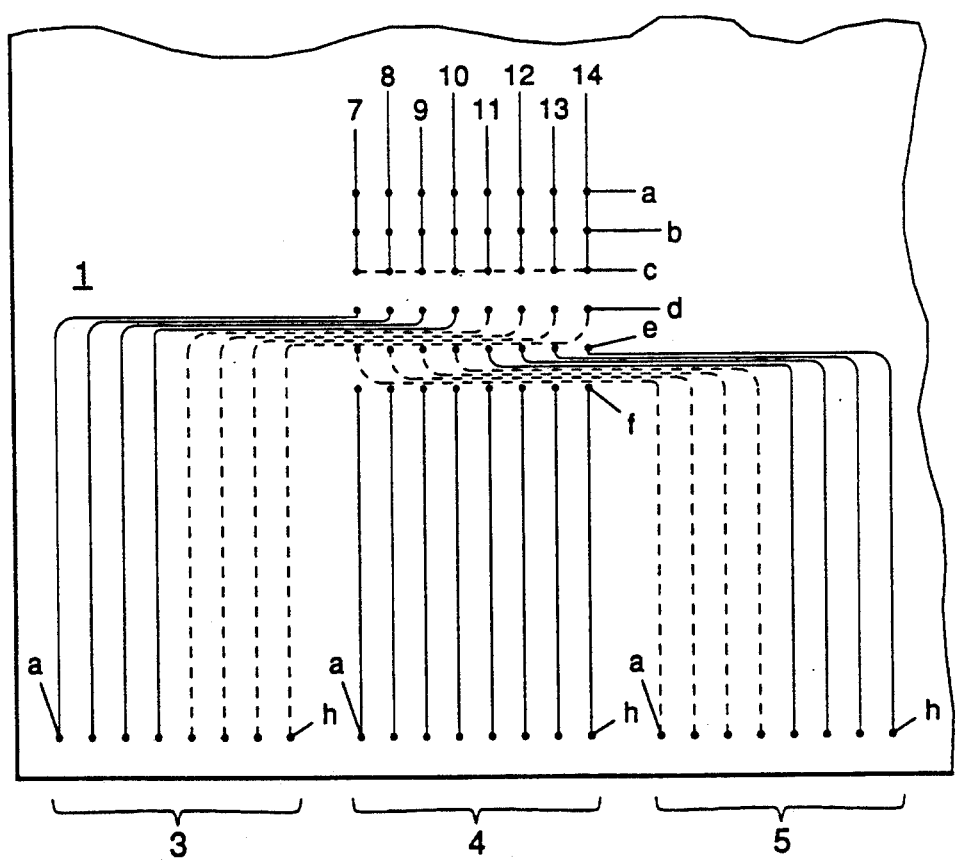
FIG. 2 diagrammatically shows the underside of the printed circuit board shown in FIG. 1.

FIG. 2 is a view of the underside of the printed circuit board as shown in FIG. 1, showing a possible pattern of printed circuitry for the embodiment described with reference to FIG. 1. The printed circuit board is assumed to have printed circuitry on both sides, the circuitry on the underside being shown in dotted lines in FIG. 2. The contact holes within rows a, b and c and within each of the columns 7-14 are interconnected. The respective connection pins on that side of the DIL package are connected to the same connections of the other circuitry (not shown) on the printed circuit board 1. It is noted, however, that it is not essential to the principle of the invention that all connection pins to be connected to the other circuitry on the printed circuit board and/or all connection pins to be connected to one of the outputs 3, 4 or 5 are located on a long side of the package. The contact holes a-h of row d are connected to the respective connections a-h of output 3; the contact holes a-h of row e are connected to the respective connections a-h of output 5 and the contact holes a-h of row f are connected to the respective connections a-h of output 4. As explained above, the invention provides a very simple possibility of connecting an IC mounted in a DIL package in different ways to an electronic circuit provided on the printed circuit board, while the space on the printed circuit board required for this option is minimal and the choice can be made in an extremely simple manner by simply mounting the DIL package in an IC base in a different location. In certain cases it is not even necessary to use an IC base. When during manufacture of a printed circuit board the choice for the connection of the IC is made definitively, it is also possible to mount the connection pins of the DIL package directly in the desired holes in the printed circuit board in the manner according to the invention and connect them permanently at that point by soldering.

Although in the foregoing the invention has been discussed with reference to an IC to be connected in three different ways, it will be clear that the principle according to the invention can also be applied if two different ways (n=2) are required, in which case q=4, or more than three different ways.

I claim:

1. A printed circuit board (1) for mounting a plurality of connection pins of at least one integrated circuit to printed circuitry on said printed circuit board in a different positions, where n is an integer $\geq 2$, wherein the integrated circuit is mounted in a dual-in-line (DIL) package (2) having two opposed long sides with an equal number of connection pins along each of said long sides and connected to the integrated circuit; said printed circuit board comprising:

a plurality of contact holes through said printed circuit board and through a plurality of conductive traces upon said printed circuit board, wherein each of said contact holes is suitable for receiving a connection pin of said DIL package; and said plurality of contact holes being arranged in a matrix of p columns (7-14) of q rows (a-f) of contact holes, with p being an integer having a value greater than or equal to the number of connection pins along one long side of said DIL package, q being an integer having a value greater than or equal to 2n, and with a distance between successive rows of contact holes being such that when the connection pins along both long sides of said DIL package are inserted into two of said rows of contact holes (a, d), n−1 rows of contact holes (b, c) are present between the rows used by said connection pins.

2. The printed circuit board of claim 1 wherein n=3.

3. A printed circuit board (1) for mounting a plurality of connection pins of at least one integrated circuit to printed circuitry on said printed circuit board in n different positions, where n is an integer $\geq 2$, wherein the integrated circuit is mounted in a dual-in-line (DIL) package (2) having two opposed long sides with an equal number of connection pins along each of said long sides and connected to the integrated circuit; said printed circuit board comprising:

- a mounting base (6) having a plurality of sockets connected to associated socket pins, wherein said plurality of sockets are conductively connected to a plurality of contact holes through said printed circuit board and through a plurality of conductive traces upon said printed circuit board and each of said sockets being suitable for receiving a connection pin of said DIL package; and

- said plurality of sockets form a matrix of p columns (7-14) and q rows (a-f) of sockets, with p being greater than or equal to the number of connection pins along one side of said DIL package, q being greater than or equal to 2n, and a distance between successive rows of sockets being such that when the connection pins along both sides of said DIL package are inserted into two of said rows of sockets (a, d), n−1 rows of contact holes (b, c) are present between the rows used by said connection pins.

4. The printed circuit board of claim 2 wherein n=3.

* * * * *